Sept. 11, 1962 A. G. CHYNOWETH ET AL 3,053,998

THREE STABLE STATE SEMICONDUCTIVE DEVICE

Filed Oct. 14, 1959

INVENTORS: A. G. CHYNOWETH
W. L. FELDMANN
G. L. PEARSON

BY Arthur J. Torsiglieri

ATTORNEY 3,053,998
Patented Sept. 11, 1962

3,053,998

THREE STABLE STATE SEMICONDUCTIVE DEVICE

Alan G. Chynoweth, Summit, William L. Feldmann, Bernardsville, and Gerald L. Pearson, Bernards Township, Somerset County, N.J., assignors to Bell Telephone Laboratories, Incorporated, New York, N.Y., a corporation of New York Filed Oct. 14, 1959, Ser. No. 846,460
1 Claim. (Cl. 307—88.5)

This invention relates to semiconductive devices exhibiting tristable characteristics and more particularly to circuits embodying such devices.

There is a need in many systems of a simple and reliable circuit which is capable of three stable levels. Typical of possible applications is an "and" circuit where the occurrence of two events can be indicated by switching a circuit element in turn from a first state through a second state to a third state, whereas the occurrence of only one of the events switches the circuit element only to the second state.

The present invention is directed toward satisfying this need.

There is known to workers in the art a semiconductive diode including a single rectifying junction which exhibits a negative resistance to an applied signal of appropriate magnitude and of polarity to bias it in the forward direction. The negative resistance arises from quantum mechanical tunneling of charge carriers through an abrupt rectifying junction between two degenerate zones of opposite conductivity type. Such a diode is now generally described as an Esaki or tunnel diode. It is a characteristic of a rectifying junction of the kind described that it exhibits a low resistance even to applied signals of small magnitude and of the polarity to bias it in reverse.

We have recognized that because of this low reverse impedance it is feasible to incorporate in a single wafer two such rectifying junctions oppositely poled and effectively in series and thereby to achieve across an output pair of electrode connections a net negative resistance effect for applied signals of appropriate magnitude of either polarity.

Additionally, we have recognized that by inclusion of a third electrode connected to the intermediate zone of the three zones of the wafer defined by the pair of rectifying junctions the voltage-current characteristic measured across the output pair of electrode connections can be made asymmetric and that, as a consequence of such asymmetry, by the inclusion of a suitable load the resulting arrangement will exhibit three stable states.

In an illustrative embodiment of the invention, a monocrystalline silicon wafer includes a bulk portion which is n-type, and two p-type aluminum-boron alloy regions. Separate electrodes are connected to each of the two alloy regions and to the bulk portion. Each of the two rectifying junctions between the bulk portion and the alloy regions is designed to exhibit the Esaki effect. A bias is applied between the electrode which connects to the intermediate bulk portion and the lead to one of the alloy regions. The wafer is inserted in an appropriate utilization circuit by means of leads to the two alloy regions. The circuit parameters are appropriately related to provide tristable operation.

The invention will be better understood from the following more detailed description, taken in conjunction with the accompanying drawing, in which.

Figure 1:
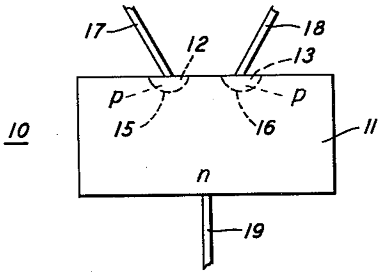
FIG. 1 shows in section a circuit element for use in the invention.

With reference now to the drawing, semiconductive device 10 comprises a silicon monocrystalline wafer whose bulk portion 11 is degenerate n-type and which further includes degenerate p-type alloy regions 12 and 13 spaced apart on one major surface of the wafer. As the terms are used by workers in the art, a degenerate n-type semiconductor is one in which the Fermi level lies in the conduction band and a degenerate p-type semiconductor is one in which the Fermi level lies in the valance band. Each of the p-n rectifying junctions 15 and 16 is a narrow junction of the type that exhibits quantum mechanical tunneling to the extent that the junction exhibits a negative resistance at low forward voltages, i.e., the Esaki effect. Typically, this can be achieved by utilizing as the starting material n-type silicon having a specific resistivity of .0014 ohm-centimeter and alloying thereto a 3.5 mil wire which is of aluminum doped with .75 percent boron. Alternatively, the starting material may be n-type germanium having a specific resistivity of .0035, and an aluminum-boron wire may be alloyed thereto for forming the Esaki junctions.

Electrodes 17, 18 and 19 make low resistance connections to p-type regions 12 and 13 and the n-type bulk portion 11, respectively. When the p-type regions 12 and 13 have been formed by the alloying of aluminum-boron wires, electrodes 17 and 18 can be the remnants of such wires. Electrode 19 typically is a gold wire doped with antimony.

Figure 2A:
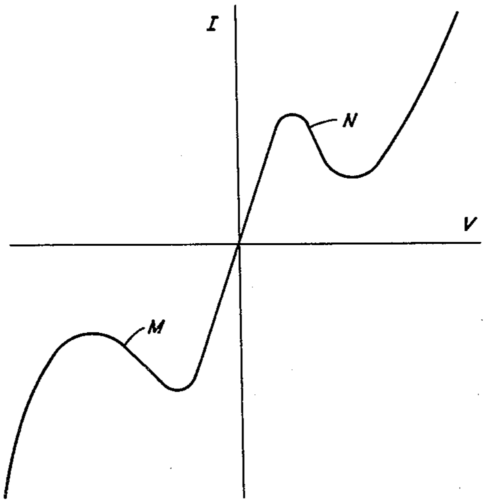
FIGS. 2A and 2B are plots of the voltage-current characteristics of the circuit element shown in FIG. 1 without and with a bias applied to such element, respectively.

FIG. 2A shows the voltage-current characteristic of the device shown in FIG. 1 in the absence of any bias on electrode 19, i.e., when electrode 19 is left floating. As can be seen from the plot, there is a negative resistance portion is each of the first and third quadrants. Each of these negative resistance portions M, N is associated with a different one of the two p-n junctions.

Figure 2B:
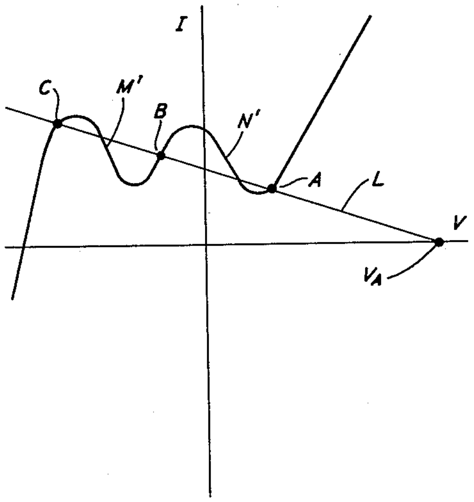

FIG. 2B shows the voltage-current characteristic of the same device when there is applied an appropriate bias to the electrode 19. The characteristic retains its two negative resistance regions M' and N'. However, it is distorted sufficiently so that a load line L may be drawn which intersects the characteristic at points A, B and C. Each of these points which lie on positive resistance portions of the characteristic corresponds to a stable operating point.

In a manner known to workers in the art, to achieve operation along the particular load line shown there need be inserted in series between the two electrodes 17 and 18 a load whose resistance $R_L$ corresponds to the reciprocal of the slope of the load line and a D.-C. voltage supply $V_A$ of magnitude corresponding to the point of intersection $V_A$ of the load line with the voltage axis.

Figure 3:
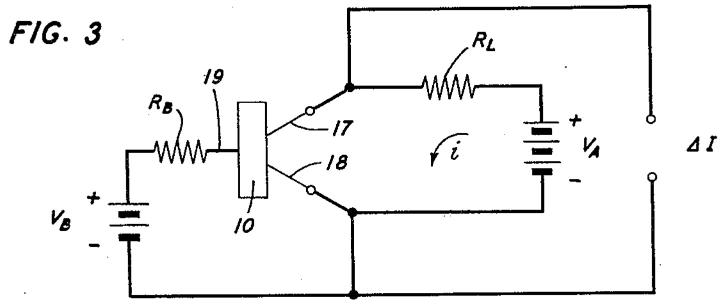
FIG. 3 shows schematically the circuit element of FIG. 1 interconnected in a typical circuit for utilization of its tristable properties in accordance with the invention.

In the circuit arrangement shown in FIG. 3 the circuit element 10 of the kind described has its two electrodes 17 and 18 interconnected by way of the load resistor $R_L$ and the D.-C. voltage supply $V_A$. The electrode 19 is interconnected to the electrode 18 by way of the resistor $R_B$ and the D.-C. voltage supply $V_B$. The values of $R_B$ and $V_B$ are chosen to provide the operating characteristic shown in FIG. 2B. Within limits the higher the voltage $V_A$ the higher the peak associated with point C and the lower the node associated with point A.

Also interconnected between electrodes 17 and 18 are the input terminals between which are applied the input pulses used to step the circuit element to successive stable positions. For input current pulses of polarity the same as that flowing through the load, the circuit element is switched from A to B to C in turn with successive pulses. For input current pulses of the opposite polarity the circuit element is switched oppositely from C to B to A in turn.

It can be seen also that the resulting arrangement can be used essentially as a double throw-single pole switch. If the element is biased initially to be in the B state, an input of one polarity will switch it to the A state, while an input of opposite polarity will switch it to the C state.

Various other applications will appear to a worker in the art for a circuit element having the characteristics described.

It will also be obvious that various other designs and fabricating processes for the circuit element may be developed without departing from the spirit and scope of the invention. For example, various other semiconductive materials, such as the group III–group V intermetallic compounds, can be employed. Additionally, other electrode connections may be applied to achieve additional or complementary functions.

What is claimed is:

In combination, a circuit element comprising a semiconductive wafer which includes one degenerate zone of one conductivity type intermediate between two degenerate zones of the opposite conductivity type for defining in the wafer a pair of p-n junctions each of which exhibits a negative resistance to forward biases of appropriate magnitude, and separate electrode connections to the three zones of the wafer, a first circuit path between the two connections to the two spaced degenerate zones including a load and a voltage source, a biasing circuit connected between the connection to the intermediate degenerate zone and one of the connections to the other spaced degenerate zones including a voltage source of magnitude sufficient that the load line intersects the voltage-current output characteristic at three stable positions, and a control circuit path connected between the two connections to the two spaced degenerate zones, including means for switching the circuit element between those three stable positions.

References Cited in the file of this patent

UNITED STATES PATENTS

| | | |
|---|---|---|
| 2,829,999 | Gudmundsen | Apr. 8, 1958 |
| 2,863,056 | Pankove | Dec. 2, 1958 |
| 2,993,129 | Petrocelli et al. | July 18, 1961 |

FOREIGN PATENTS

| | | |
|---|---|---|
| 1,061,830 | Germany | July 23, 1959 |

OTHER REFERENCES

Article, "Tunnel Diode: Big Impact," page 61 of Electronics for August 1959.

Article, Tunnel Diode—New Electronic Workhorse, 6 pages from "Electronics Industries" for August 1959.